(12) United States Patent
Murai et al.

(10) Patent No.: US 7,736,953 B2
(45) Date of Patent: Jun. 15, 2010

(54) SEMICONDUCTOR MEMORY AND METHOD OF FABRICATING THE SAME

(75) Inventors: Hiroshi Murai, Aizuwakamatsu (JP); Masahiko Higashi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 575 days.

(21) Appl. No.: 11/291,342

(22) Filed: Nov. 30, 2005

(65) Prior Publication Data
US 2006/0091422 A1 May 4, 2006

Related U.S. Application Data

(63) Continuation of application No. PCT/JP2004/017809, filed on Nov. 3, 2004.

(51) Int. Cl.
*H01L 21/82* (2006.01)
(52) U.S. Cl. ...................... 438/129; 438/128
(58) Field of Classification Search ............. 438/201, 438/211, 129
See application file for complete search history.

(56) References Cited

U.S. PATENT DOCUMENTS 6,472,275 B2 * 10/2002 Mizuhashi et al. .......... 438/275
6,603,171 B2 * 8/2003 Grossi et al. ............... 257/326
2001/0054735 A1 * 12/2001 Nagai ......................... 257/314
2002/0036927 A1 3/2002 Mori et al.

FOREIGN PATENT DOCUMENTS

JP 10-189919 7/1998
JP 2002-100689 A 4/2002

OTHER PUBLICATIONS

International Search Report for PCT/JP2004/017809 (English translation).*

* cited by examiner

*Primary Examiner*—N Drew Richards
*Assistant Examiner*—Grant S Withers

(57) ABSTRACT

A semiconductor memory includes first and second source regions that are formed in a semiconductor substrate and run in orthogonal directions. The first and second source regions are diffused regions and are electrically connected to each other at crossing portions thereof. The semiconductor device may further include drain regions formed in the semiconductor substrate, bit lines that run in the direction in which the second source region runs, and a source line formed above the second source region, wherein a contact between the source line and the second source region is aligned with contacts between the bit lines and drain regions formed in the semiconductor substrate.

12 Claims, 6 Drawing Sheets

SEMICONDUCTOR MEMORY AND METHOD OF FABRICATING THE SAME

CROSS-REFERENCES TO RELATED APPLICATIONS

This is a continuation of International Application No. PCT/JP2004/017809, filed Nov. 30, 2004 which was not published in English under PCT Article 21(2).

BACKGROUND OF THE INVENTION

1. Field of the Invention

The present invention relates to a semiconductor memory, and more particularly, to a technique directed to simplifying the structure of a non-volatile semiconductor memory device and a process of fabricating the same.

2. Description of the Related Art

Flash memory, which is one type of semiconductor memories, is an electrically programmable and erasable ROM, and is also a non-volatile memory device widely used in portable phones, digital still cameras, and communications network equipment. Flash memory is mainly categorized into NOR type and NAND type. The NOR type flash memory is generally characterized in that it is randomly accessible and is faster for reading than the NAND type flash memory. There have been various proposals for schematic structures in the memory cell array in order to improve the performance of the NOR type flash memory (such as Japanese Patent Application Publication No. 2002-100689).

FIGS. 1A through 1C schematically show the structure of a conventional NOR type flash memory. More particularly, FIG. 1A is a top view of a part of the flash memory, FIG. 1B is a cross-sectional view taken along a line A-A' shown in FIG. 1A, and FIG. 1C shows gate lines in the vicinity of a source contact.

Referring to these figures, a plurality of diffused regions (active regions) 18 are formed on a main surface of a silicon semiconductor substrate 10, and run in the longitudinal direction (Y direction). In FIGS. 1A and 1C, the diffused regions 18 are schematically depicted. The diffused regions 18 are spaced apart from each other in the transverse direction (X direction). Drain regions 11 are periodically formed in the diffused regions 18. The regions indicated by the reference numerals 18 are also bit lines, which are wiring layers obtained by patterning a metal such as aluminum. The bit lines 18 are electrically connected to the drain regions 11 via drain contacts 15.

A plurality of word lines (gate lines) 17 are formed on the semiconductor substrate 10 and run in the transverse direction (X direction). The word lines 17 include gate electrodes 13. Below the gate electrodes 13, there are provided floating gates 20 formed on a tunnel oxide film on the semiconductor substrate, and insulation films 21 of ONO (oxide-nitride-oxide) formed on the floating gates 20. The gate electrodes 13 are provided on the insulation films 21.

Source regions, which run in the transverse direction as shown by arrow 14, are provided between word lines 17 adjacent to each other in the longitudinal direction. As shown in FIG. 1B, the source regions 12 are diffused regions formed in the surface of the semiconductor substrate 10. The source regions 12 are set at a reference potential Vss (for example, ground potential), and may be called Vss lines. A source line 19, which runs in the longitudinal direction of the semiconductor substrate 10, is formed every so many multiple bit lines 18 (for example, every eighth or sixteenth bit lines). The source line 19 is a wiring layer obtained by patterning a metal of, for example, aluminum into a given shape. The source line 19 is electrically connected to the source regions 12 via source contacts 16.

However, the NOR type flash memory as shown in FIGS. 1A through 1C has the following problems.

Firstly, the gate lines 17 are required to be curved in the vicinity of the source contacts 16 in order to secure spaces for forming the source contacts 16.

Secondly, the drain contacts 15 and the source contacts 16 have geometrically different arrangements on the top view (FIG. 1A) in order to secure the spaces for forming the source contacts 16. Assuming that the pitches of the contacts 15 and 16 in the Y direction are denoted as L, the source contacts 16 and the drain contacts 15 have a positional difference equal to a ½ pitch (L/2).

Thirdly, as shown in FIG. 1C, a condition C<D must be essentially satisfied where C denotes the pitch at which the wiring layers 18 connecting the drain contacts 15 are periodically arranged, and D denotes the pitch at which the wiring layers 19 connecting the source contacts 16 are periodically arranged. This results in a dead space in the vicinity of each source contact 16.

Fourthly, the diameter $d_1$ of the source contact 16, the diameter $d_2$ of the source contact 15' adjacent to the source contact 16, and the diameters $d_3$ of the other drain contacts 15 are mutually different from one another ($d_1 > d_2 > d_3$), and may have mutually different shapes. It is thus necessary to obtain data about OPC (Optimum write Power Control) for each contact.

SUMMARY OF THE INVENTION

The present invention has been made to overcome the above drawbacks of the prior art and has an object of simplifying the structure of the semiconductor memory and the fabrication process thereof.

The present invention includes a semiconductor memory including a semiconductor substrate and first and second source regions that are formed in the semiconductor substrate and run in orthogonal directions. The source regions that run in the longitudinal and transverse directions on the surface of the semiconductor device increases the degree of formation of source contacts and contributes to simplifying the structure of the semiconductor memory and the fabrication process thereof.

The semiconductor memory may be configured so that the first and second source regions are diffused regions and are electrically connected to each other at crossing portions thereof. Preferably, the first and second source regions respectively include straight-line regions. Preferably, the semiconductor memory may further include drain regions formed in the semiconductor substrate, bit lines that run in the direction in which the second source region runs, and a source line formed above the second source region wherein a contact between the source line and the second source region is aligned with contacts between the bit lines and drain regions formed in the semiconductor substrate. Preferably, the bit lines are arranged at both sides of the second source region. Preferably, a distance between the source line and an adjacent one of the bit lines is greater than a distance between adjacent ones of the bit lines. Preferably, the semiconductor memory may further include word lines in the direction in which the first source region runs, wherein the first source region runs between adjacent word lines. The word lines may also include gate electrodes formed above the semiconductor substrate. The semiconductor memory may be a NOR type flash memory having floating gates.

The present invention also includes a method of fabricating a semiconductor device comprising the steps of forming a first source region in a semiconductor substrate, the first source region running in a first direction and forming a second source region in the semiconductor substrate, the second source region running in a second direction in orthogonal relation to the first direction. Preferably, the method may further include a step of forming floating gates and gate electrodes prior to forming the second source region.

BRIEF DESCRIPTION OF THE DRAWINGS

FIGS. 1A through 1C show the structure of a conventional NOR type flash memory, wherein FIG. 1A is a top view of a part of the flash memory, FIG. B is a cross-sectional view taken along a line A-A' shown in FIG. 1A, and FIG. 1C shows gate lines in the vicinity of a source contact;

FIGS. 2A through 2C depict a NOR type flash memory in accordance with an aspect of the present invention, wherein FIG. 2A is a top view of the flash memory, FIG. 2B is a cross-sectional view taken along a line B-B' shown in FIG. 2A, and FIG. 2C shows gate lines in the vicinity of a source contact;

DESCRIPTION OF PREFERRED EMBODIMENTS

A description will now be given, with reference to the accompanying drawings, of embodiments of the present invention.

First Embodiment

According to an aspect of the present invention, the second source line (wiring layer) used in the aforementioned conventional structure is formed by a diffused layer. That is, the semiconductor memory with this structure has two types of diffused regions that run in the longitudinal and transverse directions, so that the gate lines (word lines) can be formed without being curved.

Figure 1A:
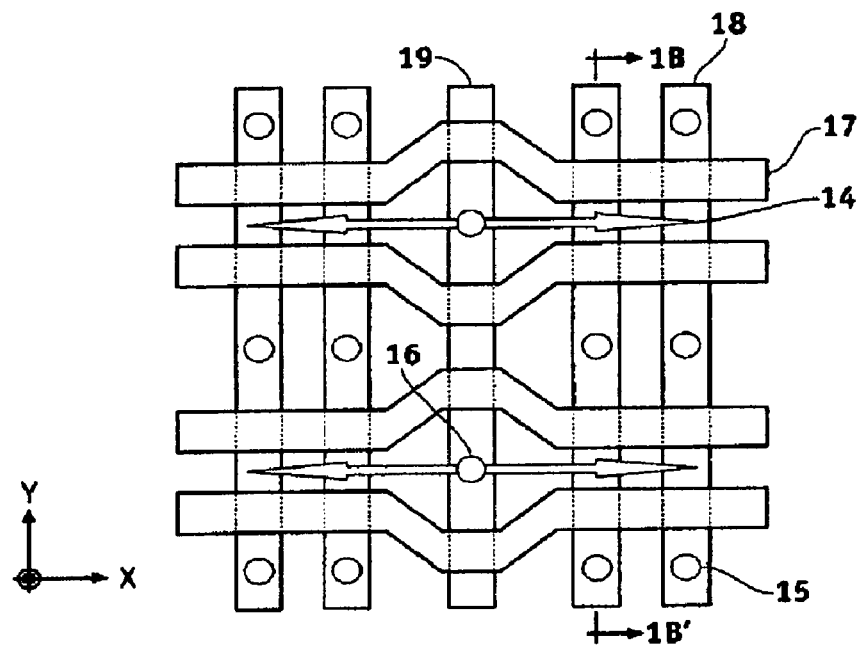
Figure 1B:
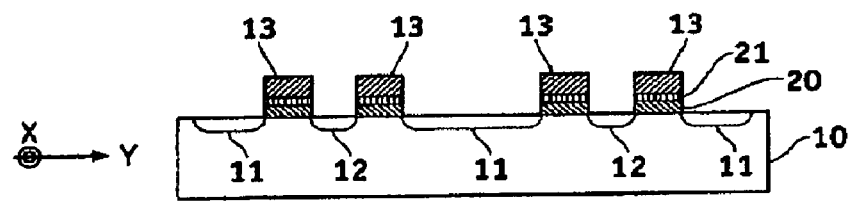
Figure 2A:
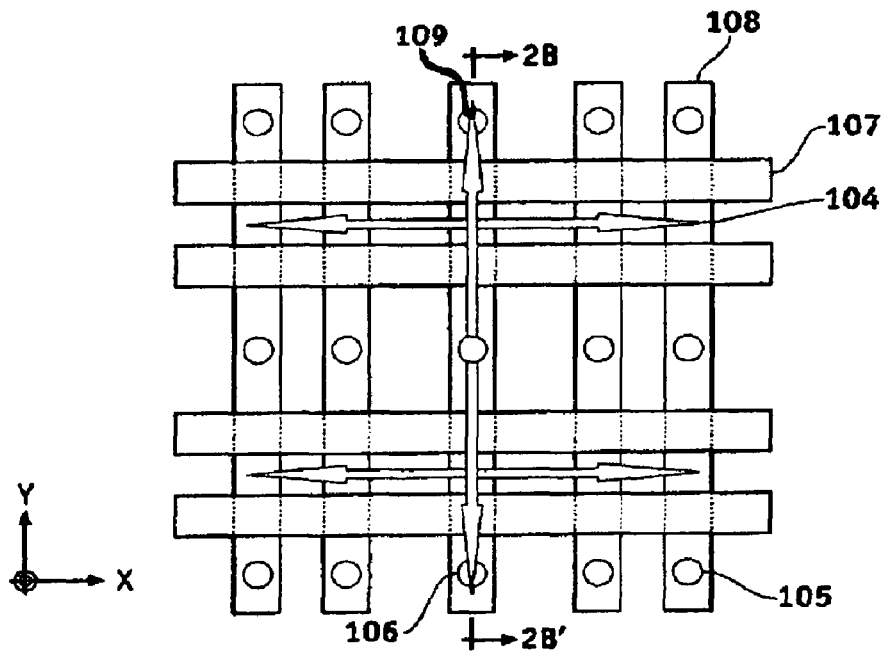
Figure 2B:
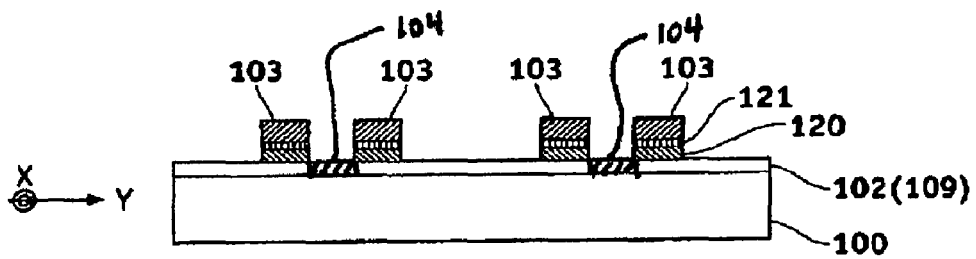
Figure 2C:
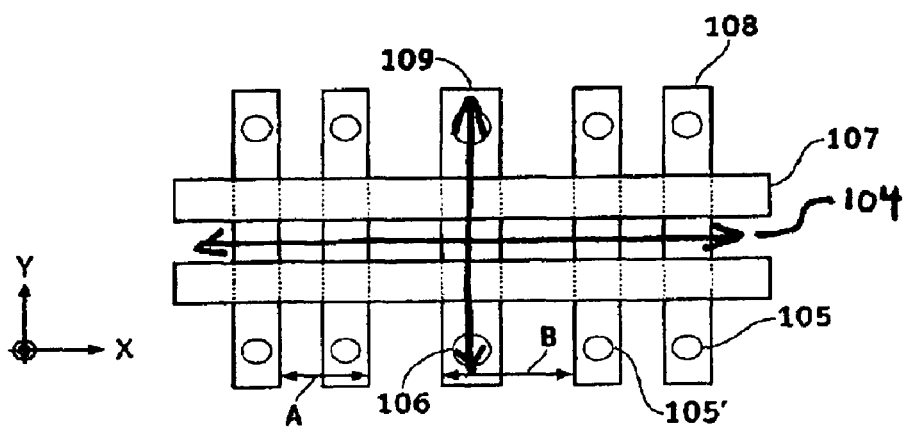

FIGS. 2A through 2C show the structure of a semiconductor memory device in accordance with an embodiment of the present invention, wherein the semiconductor memory device is a NOR type flash memory. FIG. 2A is a top view of the flash memory, FIG. 2B is a cross-sectional view taken along a line B-B' shown in FIG. 2A, and FIG. 2C shows gate lines in the vicinity of a source contact. The A-A' line cross-section shown in FIG. 1B would similarly appear in the present embodiment.

Figure 1C:
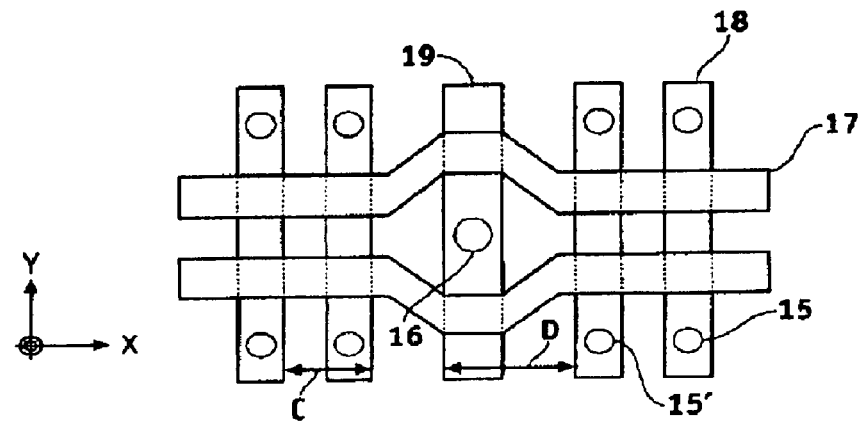

Referring to FIG. 2B, a diffused region (active region) 102, which runs in the longitudinal direction (Y direction), is formed on the main surface of a silicon semiconductor substrate 100. The diffused region 102 in FIG. 2B is a source region (second source region), and forms a source line 109. This source line 109 is substituted for the source line 19 (FIGS. 1A and 1C) formed by the metal wiring layer used in the conventional memory device. The source line 109 is provided every so many predetermined number of bit lines 108 (for example, every eight or sixteen bit lines). The source line 109 crosses the source lines formed by the diffused regions that run in the X direction. That is, the diffused region 102 and the diffused regions (corresponding to the diffused regions 12 shown in FIG. 1B) of the transverse source lines 104 cross each other. The crossing regions make electric connections between the source line 109 and the source lines 104, which may be set at an identical potential. The source line 109 may be electrically connected to a wiring layer of a metal such as aluminum via source contacts 106.

The bit lines 108 are wiring layers of a metal such as aluminum. Diffused layers are formed in the main surface of the semiconductor substrate 100 and are located below the bit lines 108. The drain regions 11 (FIG. 1B) are periodically arranged in the diffused regions below the bit lines 108, and are connected thereto via drain contacts 105.

Multiple word lines (gate lines) 107, which run in the transverse direction (X direction), are formed on the semiconductor substrate 100. The word lines 107 include gate electrodes 103. Below the gate electrodes 103, there are provided floating gates 120 formed on a tunnel oxide film on the semiconductor substrate 100, and insulation films 121 of ONO (oxide-nitride-oxide) formed on the floating gates 120. The gate electrodes 103 are provided on the insulation films 121 of ONO.

In the flash memory with the above-mentioned structure, there are provided two types of source lines 104 and 109 that run in the transverse and longitudinal directions and are formed by the diffused regions in the crystal of the semiconductor substrate 100. Source contacts 106 placed similarly on the source lines 104 as the source contacts 16 provided in the source lines 14 in the X directions (FIG. 1B) are no longer needed. This makes it possible to secure the spaces necessary for forming the source contacts 106 without bending the gate lines (word lines) 107 and to reduce the memory cell area.

The absence of these source contacts 106 in the source lines 104 makes it possible to align the drain contacts 105 and the source contacts 106 in the transverse direction without any positional difference. The pitch at which the source contacts 106 are arranged in the Y direction may be the same as those at which the drain contacts are arranged in the Y direction. The drain contacts 105 and the source contacts 106 may be arranged in lines in the X direction. It is also possible to design the source contacts 106, the drain contacts 105' adjacent to the source contacts 106, and the other drain contacts 105 so as to have an identical diameter and/or shape.

Further, as shown in FIG. 2C, it is possible to design a layout such that the distance B between the source line 109 for connecting the source contacts 106 and the bit lines (wiring layer) 108 adjacent thereto is set greater than the distance A between the adjacent bit lines 108. Furthermore, a mask used in ion implantation for forming the source lines may easily be aligned because of the absence of the bent portions of the gate lines 107.

A semiconductor memory device in accordance with the present invention can be greatly simplified due to the use of the source lines formed by the diffused layers running in the longitudinal and transverse directions and can be fabricated by a simplified process, which will be described below as a second embodiment.

Second Embodiment

Figure 3A:
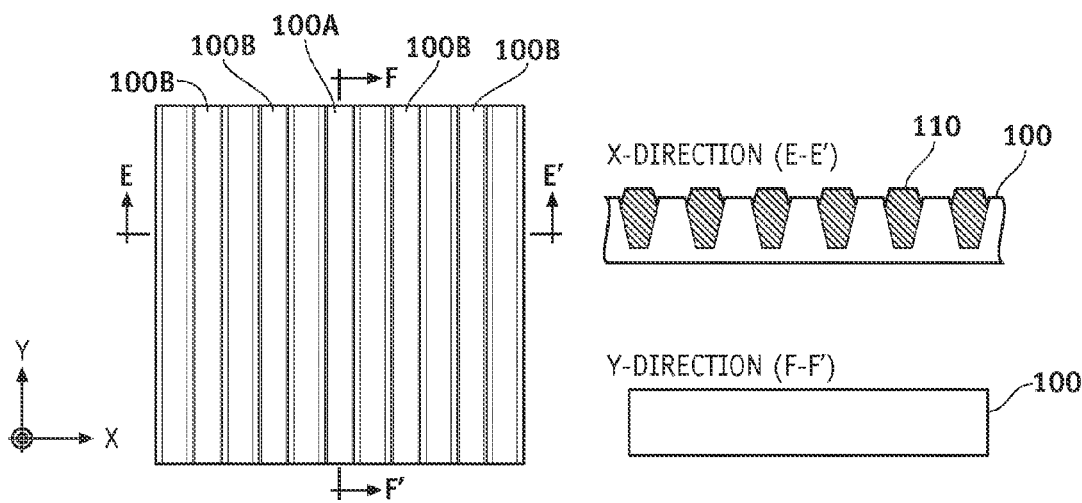
FIGS. 3A through 3C show a process of fabricating the flash memory in accordance with one aspect of the present invention, wherein there is illustrated a sequence that ranges from a step of forming an STI (Shallow Trench Isolation) to a step of forming source lines and floating gates running in the longitudinal direction.
Figure 4A:
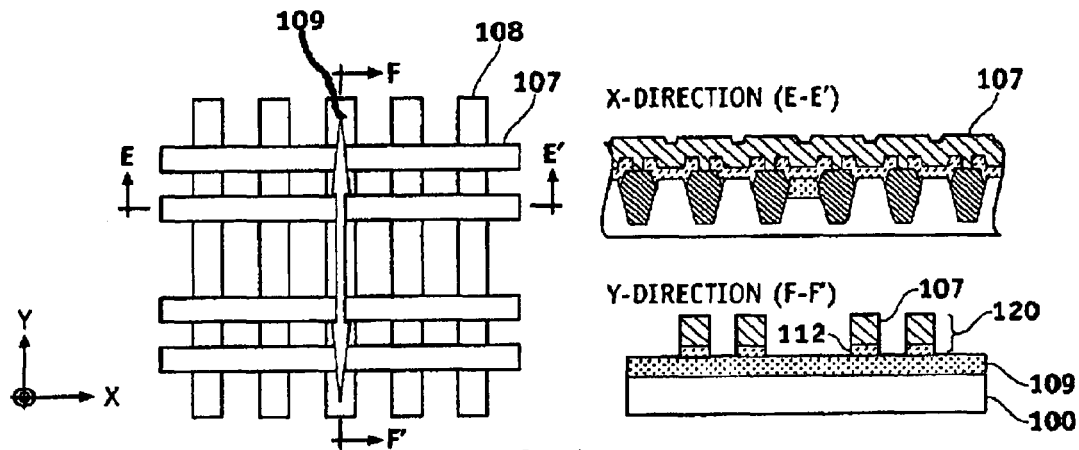
FIGS. 4A and 4B show a process of fabricating the flash memory in accordance with one aspect of the present invention, wherein there is illustrated a subsequent sequence that ranges from a step of forming gates to a step of forming source lines running in the transverse direction.
Figure 4B:
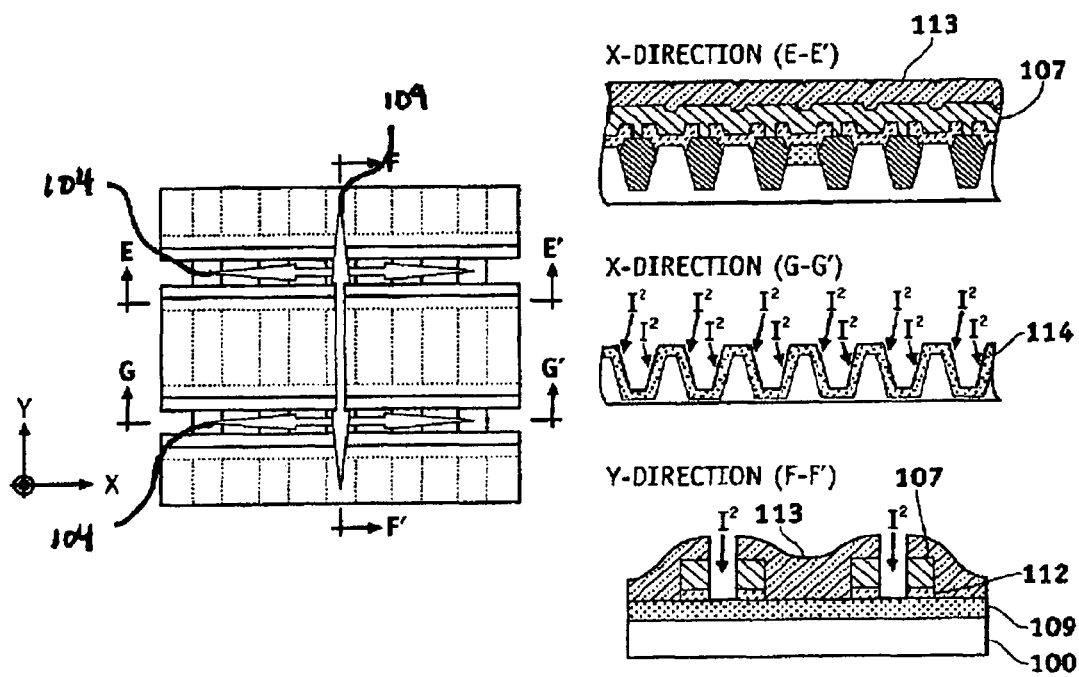
Figure 5A:
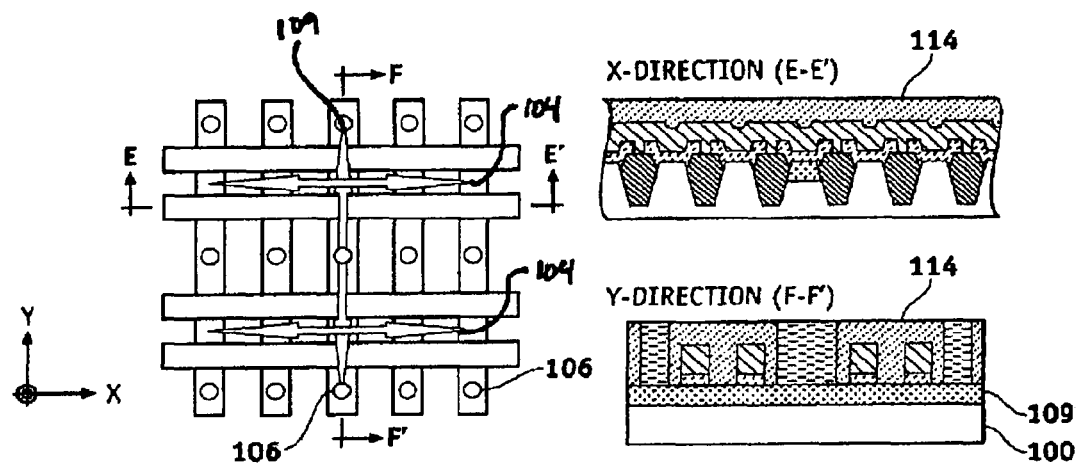
FIGS. 5A and 5B show a process of fabricating the flash memory in accordance with one aspect of the present invention, wherein there is illustrated a further subsequent sequence that ranges from a step of forming contacts to a step of forming wiring layers.
Figure 5B:
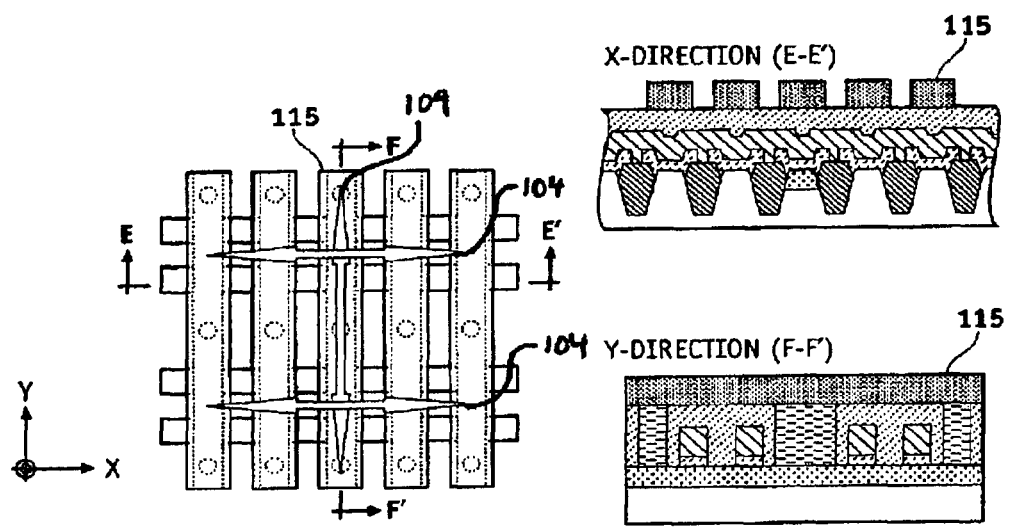
Figure 6:
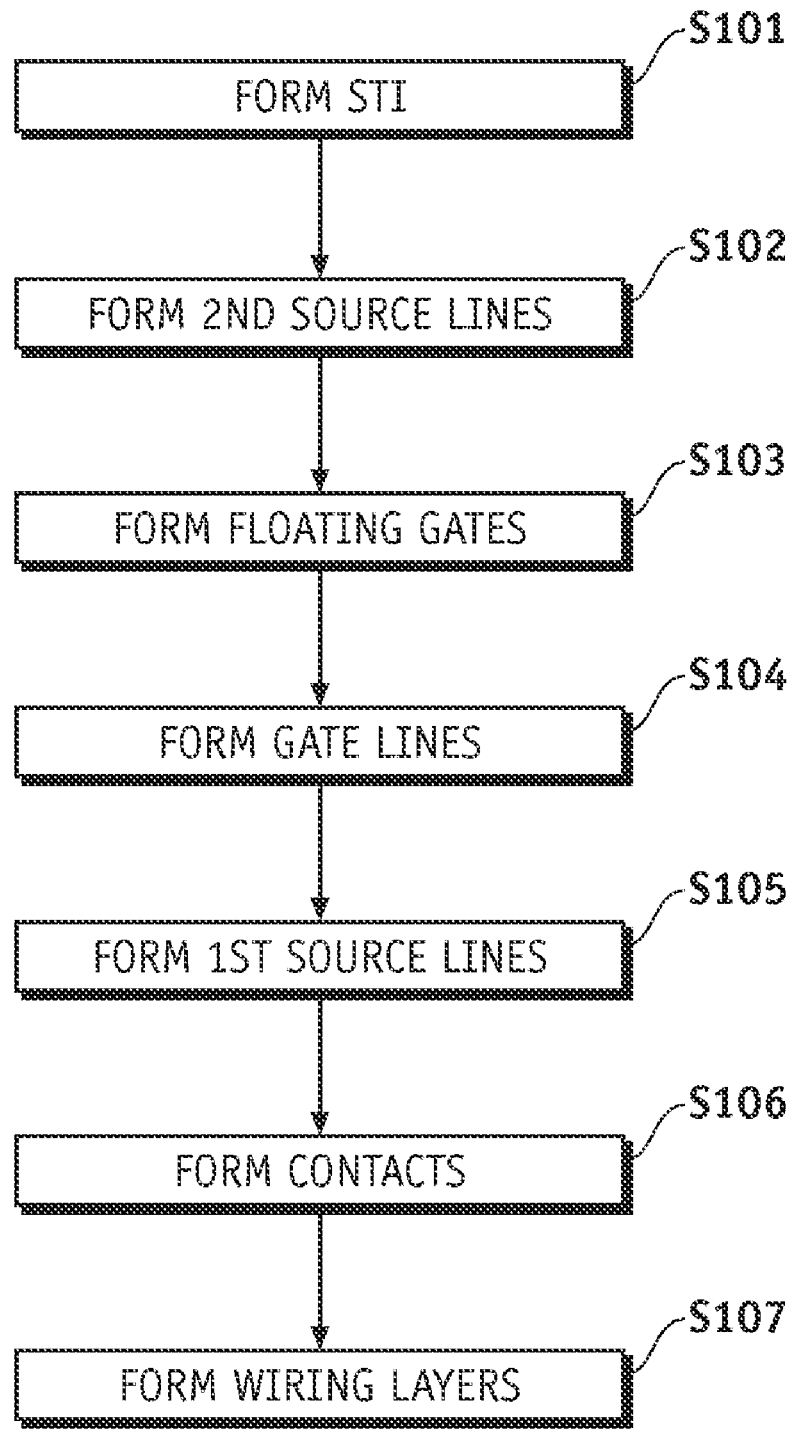
FIG. 6 is a flowchart of the entire process of fabricating the flash memory in accordance with one aspect of the present invention.

FIG. 3A through FIG. 6 are diagrams that show a process of fabricating a flash memory in accordance with an embodiment of the present invention. More particularly, FIGS. 3A through 3C show a process sequence that ranges from the step of forming an STI (Shallow Trench Isolation) to the step of forming the longitudinal source lines 109 and the floating gates. FIGS. 4A and 4B show a subsequent process sequence that ranges from the step of forming gates to the step of forming the transverse source lines 104. FIGS. 5A and 5B show a subsequent sequence that ranges from the step of forming contacts to the step of forming wiring layers. FIG. 6 is a flowchart of the entire process of fabricating the flash memory in accordance with one aspect of the present invention.

In each of FIGS. 3A through 6, the left-hand side figure is a schematic top view, the upper right-hand side figure is a cross-sectional view taken along a line E-E' shown in the left-hand side figure, and the lower right-hand side figure is a cross-sectional view taken along a line F-F' shown in the left-hand side figure. In FIG. 4B, there is additionally illustrated in the middle right-hand figure a cross-sectional view taken along a line G-G' shown in the left-hand side figure.

Referring to FIG. 3A, STI is formed on one of the opposing main surfaces of the silicon substrate 100 by etching the surface thereof and bury resultant grooves with an insulator 110. The surface region of the semiconductor substrate 100 is partially segmented so that stripes running in the longitudinal direction are formed on the surface and are exposed. The STI may be formed by known photolithography and etching techniques and known gap fill techniques (FIG. 6, step S101). The STI for interelement isolation in accordance with the present invention may effectively realize downsizing of the memory cells.

In the exposed stripe-like segmented surface region of the semiconductor substrate 100, a region indicated by a reference numeral 100a in the left-hand side of figure FIG. 3A will be the source line 109 running in the longitudinal direction (Y direction) in the left-hand side figure of FIG. 4A, and a region indicated by a reference numeral 100b in the left-hand side figure FIG. 3A will be the bit line 108 running in the longitudinal direction in the left-hand side figure of FIG. 4A.

Figure 3B:
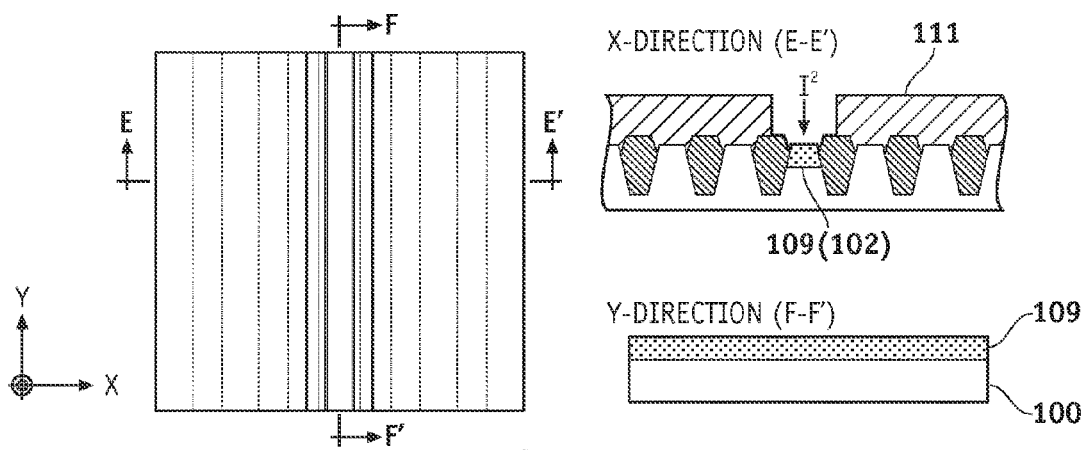

Referring to FIG. 3B, subsequent to the formation of the STI 110, the surface of the semiconductor substrate 100 is covered by a photoresist 111 except the regions indicated by the reference numeral 100a and ion implantation is performed through openings in the mask with a given depth and a given desired dose. This ion implantation results in the source line 109 (diffused layer 102) running in the Y direction as shown in FIG. 3B (FIG. 6, step S102).

Figure 3C:
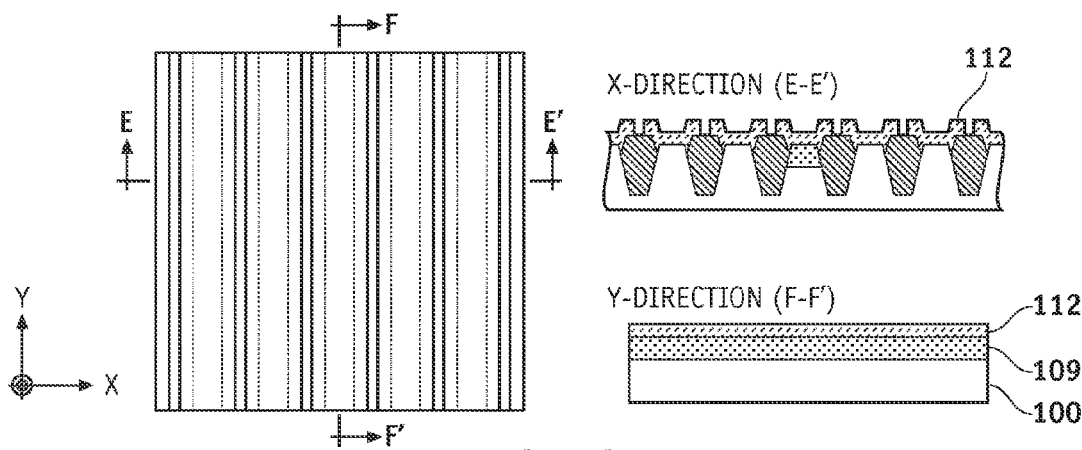

After the ion implantation, the photoresist 111 is removed, and a layer 112, which will be the floating gates 120 later, is formed on a tunnel oxide film by conventional photolithography technique and film growing and etching techniques as shown in FIG. 3C (FIG. 6, step S103).

Referring next to FIG. 4A, a layer for forming the word lines 107 is grown on the entire wafer, and is patterned into the gate lines (word lines) 109 running in the X direction by conventional photolithography and etching techniques.

This results in the gates formed by the gate lines 107 having a straight-line shape without any bent portions (FIG. 6, step S104). In the above-mentioned etching, the layer 112 is removed except for the portions located below the gate lines 107, and the resultant portions of the layer 112 are the floating gates 120 (FIG. 4A).

Then, the regions shown in the left-hand side figure in FIG. 4B are covered with a photoresist 113 as a mask and ions are implanted through openings in the mask at a given angle with a given depth and a given dose. This ion implantation results in the source lines 104 running in the X direction (FIG. 6, step S105). In this step, electrical connections are made between the source lines 109 running in the Y direction and the source lines 104 running in the X direction (FIG. 4B).

An interlayer insulation film 114 is grown on the entire surface of the wafer, and contact holes are formed in given positions by conventional photolithography and etching techniques and, as seen in FIG. 5A, the contact holes are filled with a metal so that the drain contacts 105 and the source contacts 106 can be formed (FIG. 6, step S106). Finally, referring to FIG. 5B, metal wiring lines 115 for connecting the contact holes together are formed (FIG. 6, step S107). The metal wiring lines 115 formed above the source lines in the Y direction are connected to the source lines 109 via the source contacts 106. The metal lines 115 that are the bit lines are connected to the drain regions via the drain contacts 105.

As described above, in the process of fabricating the semiconductor memory device, the regions other than the region in which the source contacts 106 are to be formed are covered with the photoresist prior to the formation of the gate lines 107 and ions are implanted so that the source lines 109 running in the Y direction are formed in the semiconductor substrate 100. Then, the source lines running in the X direction are formed in the semiconductor substrate 100 so as to be connected to the source lines 109 in the Y direction. In this manner, the source contacts 106 can be formed without bending the gate lines 107 and the source contacts 106 aligned with the drain contacts 105 can be obtained.

As described above, the present invention makes it possible to simplify the structure of the semiconductor memory and the fabrication process thereof and eliminate the various problems of a conventional semiconductor memory device.

While the preferred embodiments of the present invention have been described, the present invention is not limited to the specifically disclosed embodiments and various variations and modifications may be made within the scope of the claimed invention.

What is claimed is:

1. A semiconductor memory comprising:
a semiconductor substrate having drain regions and first source regions, each of the drain regions and first source regions comprising a diffused region formed in the semiconductor substrate and having a width, the drain regions and first source regions running in a first direction orthogonal to the width thereof, the semiconductor substrate further having at least one second source region formed therein, wherein the at least one second source region has a length that runs in a second direction orthogonal to the first direction, wherein the length of the at least one second source region is substantially longer than the width of the first source regions;
bit lines running in the second direction and coupled to the drain regions in the semiconductor substrate by a plurality of bit line contacts; and
a source metal wiring line formed above each of the at least one second source region, wherein one or more source contacts are formed to connect the source metal wiring line and the at least one second source region therebelow, and wherein each of the one or more source contacts is aligned in the first direction with one or more corresponding ones of the bit line contacts such that each of the one or more source contacts is in line in the first direction with the one or more corresponding ones of the bit line contacts.

2. The semiconductor memory as claimed in claim 1, wherein the first source regions and the at least one second source region are diffused regions and are electrically connected to each other at crossing portions thereof.

3. The semiconductor memory as claimed in claim 1, wherein the first source regions and the at least one second source region comprise straight-line regions.

4. The semiconductor memory as claimed in claim 1, wherein the bit lines are arranged at both sides of the at least one second source region.

5. The semiconductor memory as claimed in claim 1, wherein a distance between the source metal wiring line and one of the bit lines adjacent thereto is greater than a distance between adjacent ones of the bit lines.

6. The semiconductor memory as claimed in claim 1, further comprising word lines running in the first direction, wherein the first source regions run between adjacent word lines, and wherein each of the one or more source contacts and the one or more corresponding ones of the bit line contacts are aligned in the first direction between adjacent word lines such that each of the one or more source contacts is in line in the first direction with the one or more corresponding ones of the bit line contacts.

7. The semiconductor memory as claimed in claim 6, wherein the word lines include gate electrodes formed above channels in the semiconductor substrate defined by adjacent ones of the drain regions and the first source regions formed in the semiconductor substrate.

8. The semiconductor memory as claimed in claim 1, wherein the semiconductor memory is a NOR type flash memory having floating gates.

9. A method of fabricating a semiconductor device comprising the steps of:
   forming a first source region in a semiconductor substrate having a width, the first source region having a length running in a first direction orthogonal to the width thereof;
   forming a second source region in the semiconductor substrate, the second source region having a length thereof running in a second direction orthogonal to the first direction;
   forming a first metal wiring line above the second source region and running in the second direction parallel to and above the second source region; and
   forming a second metal wiring line as a bit line formed above the semiconductor substrate and running in the second direction, wherein the second metal wiring line is parallel to and adjacent to the first metal wiring line.

10. The method as claimed in claim 9, further comprising a step of forming floating gates and gate electrodes prior to forming the second source region.

11. The method as claimed in claim 9, further comprising a step of forming a floating gate and a gate electrode after the second source region is formed.

12. The method as claimed in claim 9, further comprising the steps of:
   forming a bit line contact connecting the bit line to a drain region formed in the semiconductor substrate; and
   forming a source line contact connecting the first metal wiring line to the second source region, wherein the source line contact is formed in alignment in the first direction with the bit line contact.

* * * * *